US006977198B2

(12) United States Patent
Gau

(10) Patent No.: US 6,977,198 B2
(45) Date of Patent: Dec. 20, 2005

(54) METAL-INSULATOR-METAL (MIM) CAPACITOR AND FABRICATION METHOD FOR MAKING THE SAME

(75) Inventor: Jing-Horng Gau, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/905,472

(22) Filed: Jan. 6, 2005

(65) Prior Publication Data

US 2005/0118778 A1 Jun. 2, 2005

Related U.S. Application Data

(62) Division of application No. 10/707,225, filed on Nov. 28, 2003.

(51) Int. Cl.[7] .......................................... H01L 21/8242
(52) U.S. Cl. ..................... 438/250; 438/253; 438/393; 438/396
(58) Field of Search .......................... 438/3, 238–241, 438/250–256, 381, 393–399

(56) References Cited

U.S. PATENT DOCUMENTS

| 6,066,537 | A | 5/2000 | Poh |
| 6,232,197 | B1 | 5/2001 | Tsai |
| 6,459,117 | B1 | 10/2002 | Liou |
| 6,468,858 | B1 | 10/2002 | Lou |
| 6,710,425 | B2 | 3/2004 | Bothra |
| 6,777,248 | B1 * | 8/2004 | Nabatame et al. ............. 438/3 |
| 6,838,717 | B1 | 1/2005 | Yen et al. |

* cited by examiner

Primary Examiner—H. Jey Tsai
(74) Attorney, Agent, or Firm—Winston Hsu

(57) ABSTRACT

A metal-insulator-metal (MIM) capacitor includes a first metal plate; a first capacitor dielectric layer disposed on the first metal plate and a second metal plate stacked on the first capacitor dielectric layer. The first metal plate, the first capacitor dielectric layer, and the second metal plate constitute a lower capacitor. A second capacitor dielectric layer is disposed on the second metal plate. A third metal plate is stacked on the second capacitor dielectric layer. The second metal plate, the second capacitor dielectric layer, and the third metal plate constitute an upper capacitor. The first metal plate and the third metal plate are electrically connected to a first terminal of the MIM capacitor, while the second metal plate is electrically connected to a second terminal of the MIM capacitor.

4 Claims, 11 Drawing Sheets

METAL-INSULATOR-METAL (MIM) CAPACITOR AND FABRICATION METHOD FOR MAKING THE SAME

CROSS REFERENCE TO RELATED APPLICATIONS

This is a division application of U.S. patent application Ser. No. 10/707,225 filed Nov. 28, 2003 by Jing-Horng Gau.

BACKGROUND OF INVENTION

1. Field of the Invention

The present invention relates generally to a metal-insulator-metal (MIM) capacitor. More specifically, the present invention relates to a MIM capacitor having high capacitance density and fabrication method for making the same.

2. Description of the Prior Art

Various capacitive structures are used as electronic elements in integrated circuits such as radio frequency integrated circuits (RFIC), and monolithic microwave integrated circuits (MMIC). Such capacitive structures include, for example, metal-oxide-semiconductor (MOS) capacitors, p-n junction capacitors and metal-insulator-metal (MIM) capacitors. For some applications, MIM capacitors can provide certain advantages over MOS and p-n junction capacitors because the frequency characteristics of MOS and p-n junction capacitors may be restricted as a result of depletion layers that form in the semiconductor electrodes. An MIM capacitor can exhibit improved frequency and temperature characteristics. Furthermore, MIM capacitors are formed in the metal interconnect layers, thereby reducing CMOS transistor process integration interactions or complications.

An MIM capacitor typically includes an insulating layer, such as a PECVD dielectric, disposed between lower and upper electrodes. To increase the circuit density and reduce the cost, large capacitance density is highly desirable. One known method to increase the capacitance density ($\epsilon_0 k/t_d$) is reducing the dielectric thickness ($t_d$). However, this attempt is unsuccessful since reducing the dielectric thickness ($t_d$) generates undesired high leakage current and poor RF loss tangent.

Another approach to increasing the capacitance density is using high dielectric constant (k) dielectrics for MIM capacitors. For example, U.S. Pat. No. 6,232,197, filed Apr. 7, 1999 by Tsai, assigned to United Microelectronics Corp. discloses a metal-insulator-metal for improved mixed-mode capacitor in a logic circuit. The bottom electrode of the capacitor is polycide and the top electrode is metal. The capacitor dielectric layer may be composed of silicon oxide, silicon nitride, silicon oxy-nitride, or tantalum oxide. Silicon oxide, silicon nitride and silicon oxy-nitride may be formed by using low-pressure chemical vapor deposition (LPCVD), plasma enhanced chemical vapor deposition (PECVD), or high-density plasma CVD (HDPCVD). The thickness of the capacitor dielectric layer is about from 100 to 500 angstroms.

U.S. Pat. No. 6,459,117, filed Nov. 26, 2001 by Liou, assigned to Winbond Electronics Corp. discloses an integrated circuit device with high Q MIM capacitor. The MIM capacitor dielectric layer is formed of silicon oxy-nitride ($SiO_xN_y$) which has a high dielectric constant relative to that of silicon dioxide. U.S. Pat. No. 6,468,858, filed Mar. 23, 2001 by Lou, assigned to Taiwan Semiconductor Manufacturing Company discloses a process for forming an MIM capacitor structure. Platinum is employed for both the capacitor top plate and storage node structures. A high dielectric constant material such as $Ta_2O_5$ or $BaTiO_3$ is used for the capacitor dielectric layer. The $Ta_2O_5$ or $BaTiO_3$ capacitor dielectric layer, which is deposited via chemical vapor deposition (CVD), has a thickness between about 50 to 200 Angstroms.

However, the above-mentioned prior art methods are costly since different dielectric materials are introduced. In light of the forgoing, there is a constant need to provide a new MIM capacitor structure that has high capacitance density and is cost-effective.

SUMMARY OF INVENTION

Accordingly, it is the primary object of the present invention to provide an improved MIM capacitor structure and a method for making the same.

Another object of the present invention is to provide an MIM capacitor having doubled capacitance per unit capacitor and a method for making the same.

According to the claimed invention, a metal-insulator-metal (MIM) capacitor includes a first metal plate; a first capacitor dielectric layer disposed on the first metal plate and a second metal plate stacked on the first capacitor dielectric layer. The first metal plate, the first capacitor dielectric layer, and the second metal plate constitute a lower capacitor. A second capacitor dielectric layer is disposed on the second metal plate. A third metal plate is stacked on the second capacitor dielectric layer. The second metal plate, the second capacitor dielectric layer, and the third metal plate constitute an upper capacitor. The first metal plate and the third metal plate are electrically connected to a first terminal of the MIM capacitor, while the second metal plate is electrically connected to a second terminal of the MIM capacitor.

According to one aspect of the claimed invention, a method for fabricating a metal-insulator-metal (MIM) capacitor includes the steps of:

providing a substrate;

forming, in the order of, a first metal layer, a first dielectric layer, a second metal layer, a second dielectric layer, a third metal layer, and a cap layer over the substrate;

etching the cap layer, the third metal layer, the second dielectric layer, the second metal layer, and the first dielectric layer to form an upper capacitor structure consisting of a second metal plate, a second capacitor dielectric layer, and third metal plate;

partially covering the upper capacitor structure with a photo mask that defines a first metal plate to formed in the underlying first metal layer;

simultaneously etching the first metal layer, a portion of the cap layer atop the second metal plate and the second metal plate of the upper capacitor structure that are not covered by the photo mask; and stripping the photo mask.

It is to be understood that both the foregoing general description and the following detailed description are exemplary, but are not restrictive, of the invention. Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
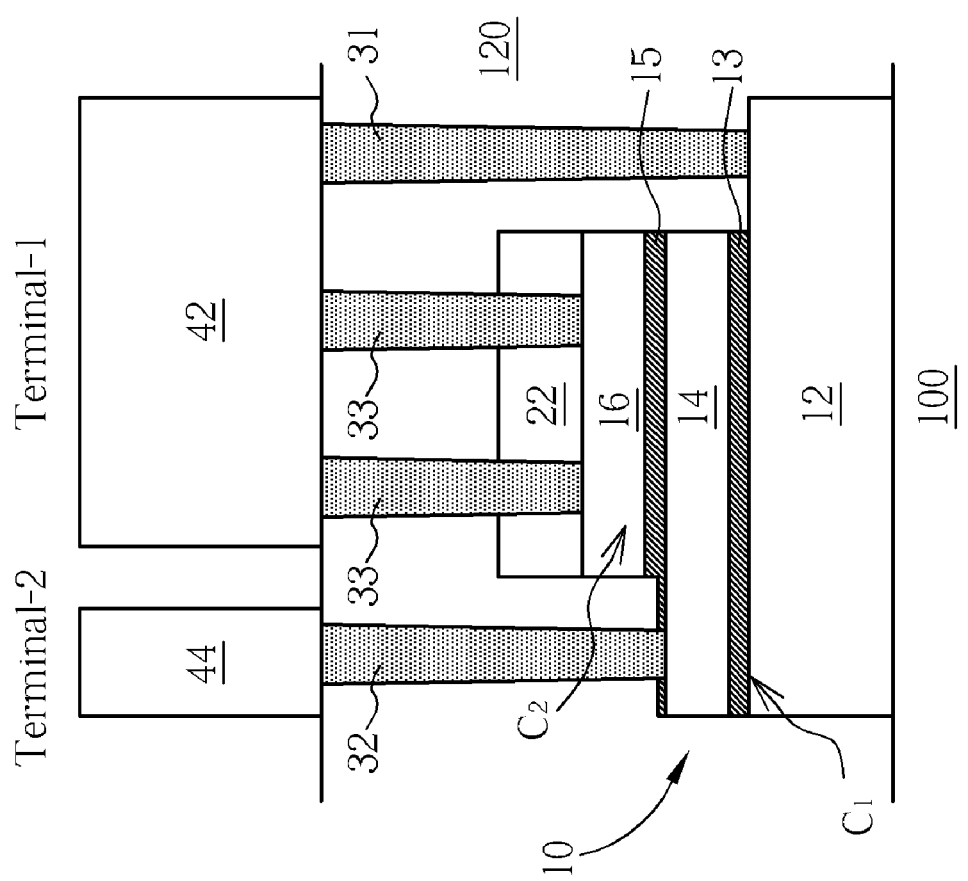
FIG. 1 is a schematic cross-sectional diagram illustrating an MIM capacitor in accordance with one preferred embodiment of the present invention.
Figure 2:
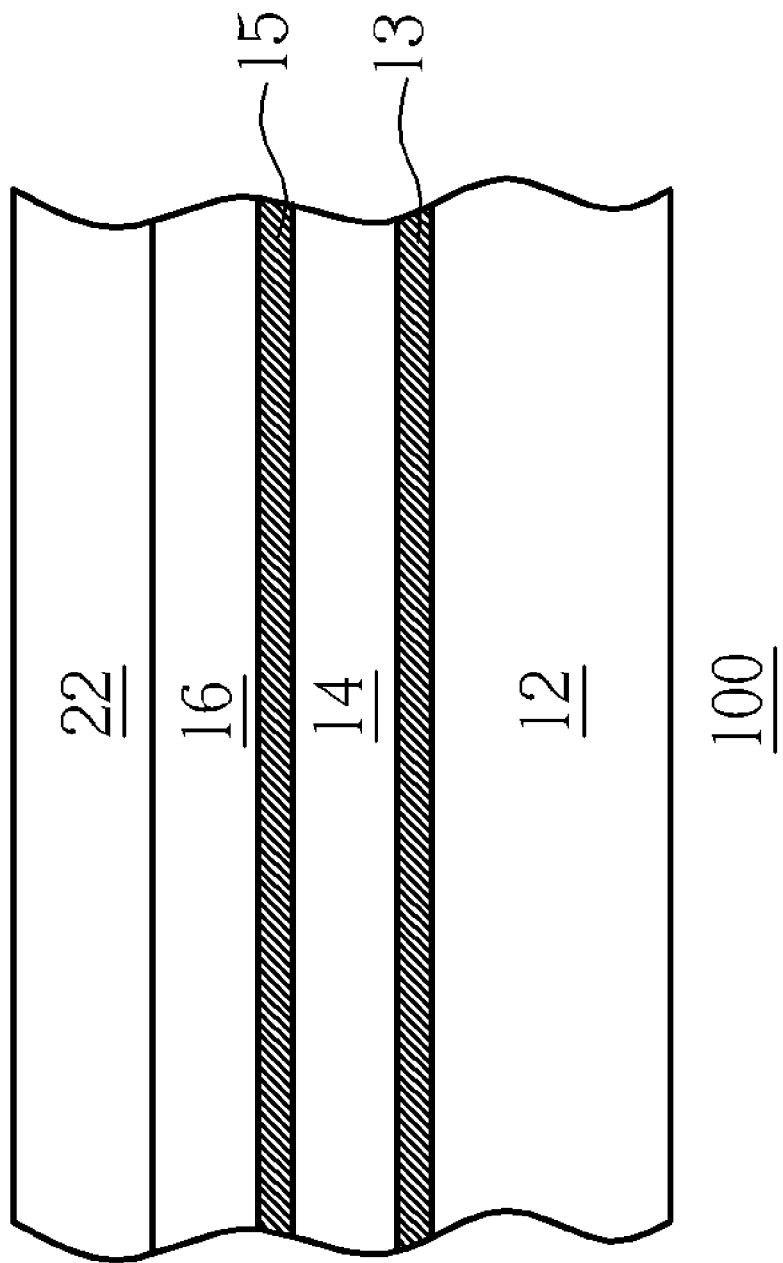
FIG. 2 to FIG. 11 are schematic cross-sectional diagrams illustrating the method for making the MIM capacitor 10 as set forth in FIG. 1 in accordance with one preferred embodiment of the present invention.

Please refer to FIG. 1. FIG. 1 is a schematic cross-sectional diagram illustrating an MIM capacitor 10 in accordance with one preferred embodiment of the present invention. The MIM capacitor 10 comprises a first metal plate 12, which may be defined on a base layer 100 such as an inter-metal dielectric (IMD) layer, but not limited thereto. The first metal plate 12 may be one of the layers of metal interconnection of an integrated circuit. For example, the first metal plate 12 may be defined simultaneously with the third layer metal (Metal-3) or fourth layer metal (Metal-4) of metal interconnection of the integrated circuit. A second metal plate 14, which is thinner than the first metal plate 12, is stacked above the first metal plate 12 and is electrically isolated from the first metal plate 12 with a first capacitor dielectric layer 13. A third metal plate 16 is stacked above the second metal plate 14 and is electrically isolated from the second metal plate 14 with a second capacitor dielectric layer 15. A cap layer 22 is deposited on the third metal plate 16. The cap layer 22 may be made of silicon dioxide or silicon nitride, preferably silicon nitride. The above-said MIM capacitor 10 is covered with an IMD layer 120. The first metal plate 12, the first capacitor dielectric layer 13, and the second metal plate 14 constitute a first capacitor ($C_1$) or lower capacitor. The second metal plate 14, the second capacitor dielectric layer 15, and the third metal plate 16 constitute a second capacitor ($C_2$) or upper capacitor.

A plurality of conductive vias are formed in the IMD layer 120. The first metal plate 12 of the above-said MIM capacitor 10 is electrically connected to a first conductive terminal 42 through at least one conductive via 31 that penetrates through the IMD layer 120. The second metal plate 14 is electrically connected to a second conductive terminal 44 through at least one conductive via 32. The third metal plate 16 is electrically connected to the first conductive terminal 42 through at least one conductive via 33 that penetrates through the IMD layer 120 and the cap layer 22. This invention features a sandwich-like MIM capacitor structure consists of the lower capacitor $C_1$ and the upper capacitor $C_2$. The first metal plate 12, namely, one electrode of the lower capacitor $C_1$, is electrically coupled with the third metal plate 16, namely, one electrode of the upper capacitor $C_2$. The second metal plate 14 serves as a common electrode of the lower capacitor $C_1$ and the upper capacitor $C_2$ and is interposed between the first metal plate 12 and the second metal plate 16.

Please refer to FIG. 2 to FIG. 11. FIG. 2 to FIG. 11 are schematic cross-sectional diagrams illustrating the method for making the MIM capacitor 10 as set forth in FIG. 1 in accordance with one preferred embodiment of the present invention, wherein like reference numerals refer to similar or corresponding elements, regions, and portions. As shown in FIG. 1, a substrate (not shown) having thereon a base layer 100 is provided. The base layer 100 may be an IMD layer, but not limited thereto. A first metal layer 12, a first capacitor dielectric layer 13, a second metal layer 14, a second capacitor dielectric layer 15, a third metal layer 16, and a cap layer 22 are sequentially deposited on the base layer 100. According to the preferred embodiment, for example, the first metal layer 12 is the third layer metal (Metal-3) of the layers of metal interconnection of the integrated circuit, and the first metal layer 12 has a thickness of about 5000 angstroms. The second metal layer 14 and the third metal layer 16 may be made of any suitable metals such as titanium or titanium nitride alloys. The second metal layer 14 and the third metal layer 16 has thickness that is thinner than the thickness of the first metal layer 12, say 1000 angstroms. Preferably, the cap layer 22 is made of silicon nitride. According to the preferred embodiment, the first capacitor dielectric layer and second capacitor dielectric layer are both made of PECVD dielectric materials.

Figure 3:
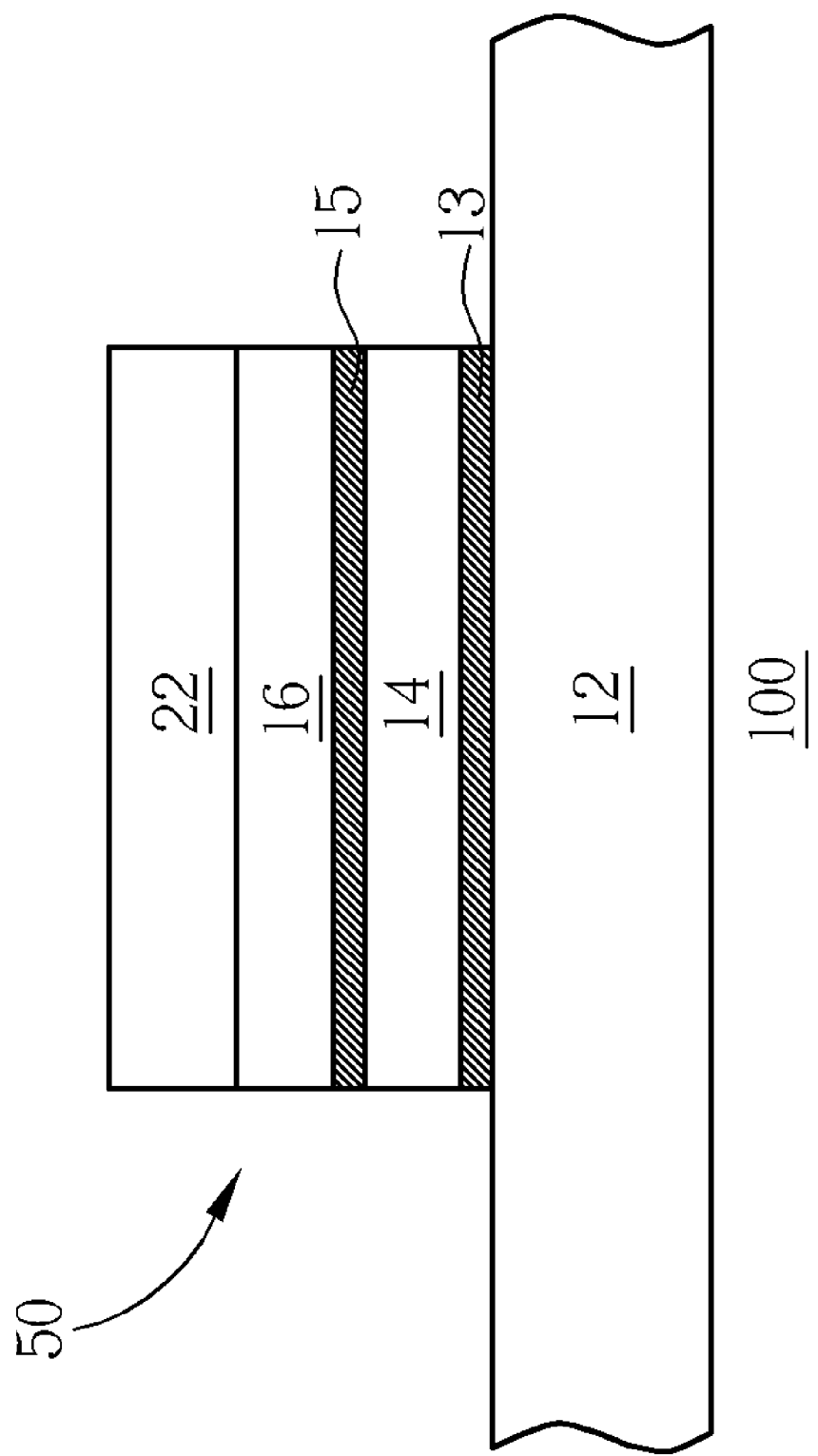

As shown in FIG. 3, a conventional lithographic process and an anisotropic dry etching process are carried out to formed an upper capacitor stack 50 consisting of the first capacitor dielectric layer 13, the second metal plate 14, the second capacitor dielectric layer 15, the third metal plate, and the cap layer 22. The upper capacitor stack 50 is defined on the first metal layer 12. In other words, after etching through the first capacitor dielectric layer 13, the dry etching stops on the first metal layer 12.

Figure 4:
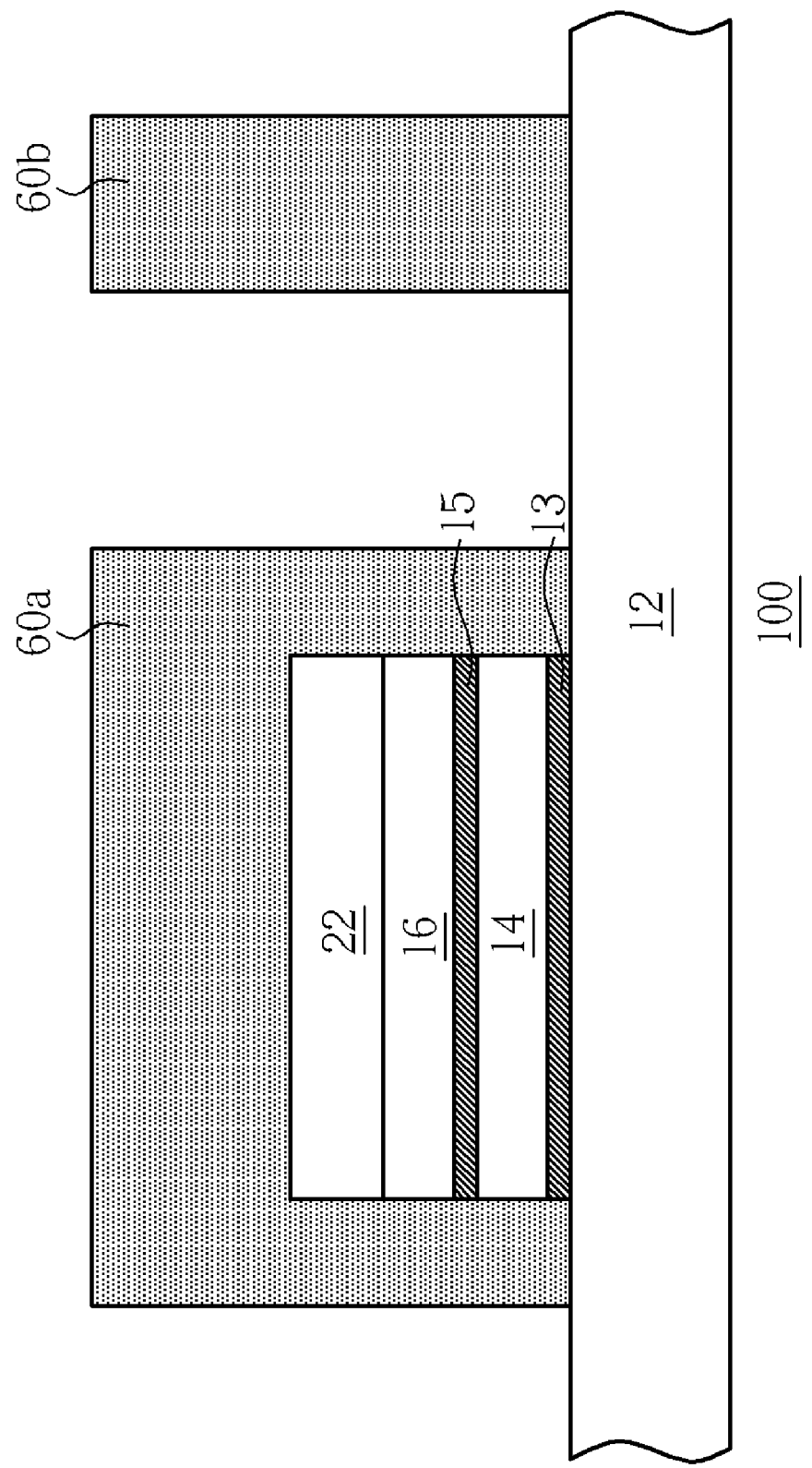
Figure 5:
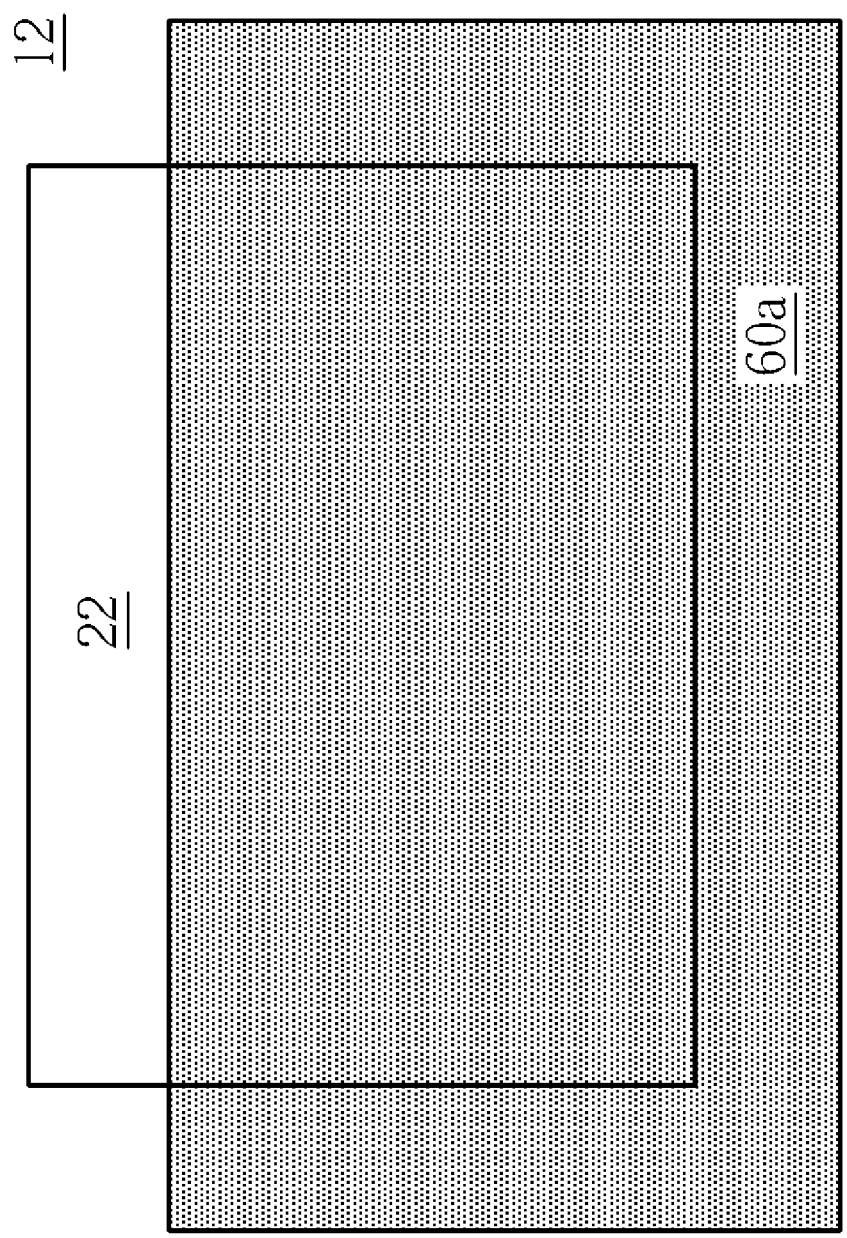

As shown in FIG. 4, a photoresist layer (not shown) is then coated on the first metal layer 12 and covers the upper capacitor stack 50. The photoresist layer is subjected to exposure and development procedures, thereby forming photo masks 60a and 60b, wherein the photo mask 60a defines the pattern and dimension of a first metal plate that serves as one electrode of a lower capacitor to be formed, while the photo mask 60b may define the wiring line pattern of Metal-3. Referring to FIG. 5, a top view presenting the photo mask 60a, the first metal layer 12, and the perspective cap layer 22 of the upper capacitor stack 50 of FIG. 4 is illustrated. As specifically indicated in FIG. 5, the photo mask 60a covers most portion of the upper capacitor stack 50. A small portion of the cap layer 22 of the upper capacitor stack 50 is therefore exposed and will be etched away in the following etching process.

Figure 6:
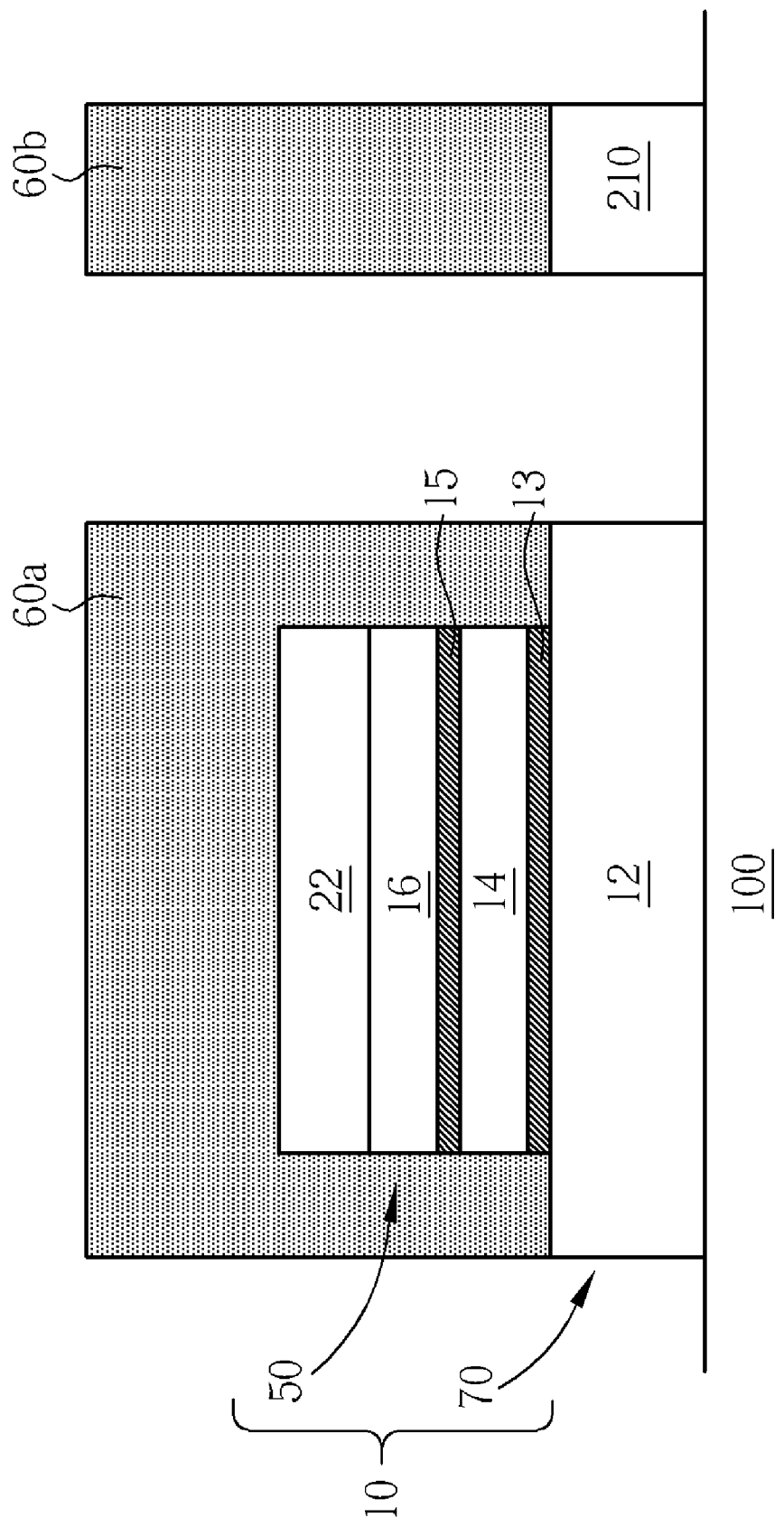
Figure 7:
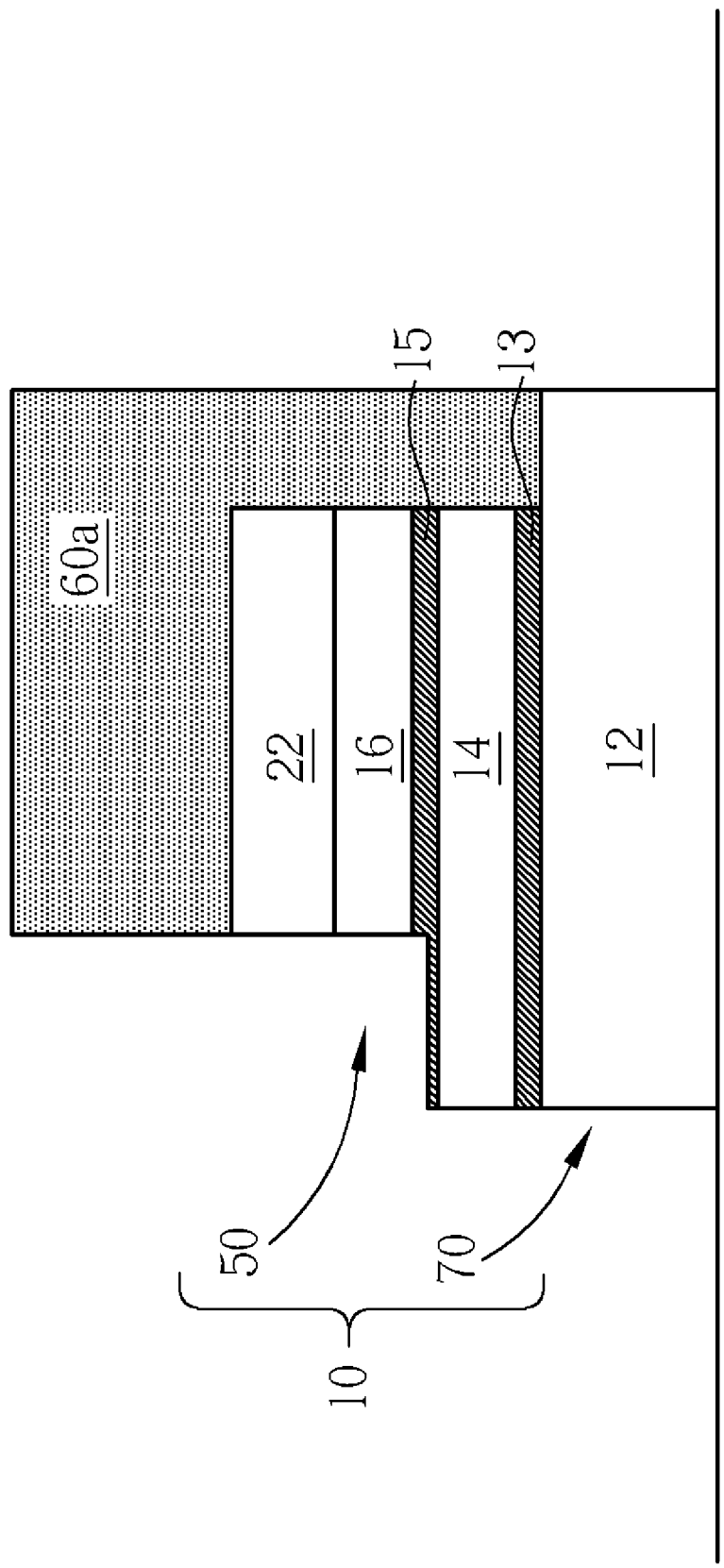

As shown in FIG. 6, a dry etching process is carried out to etch the first metal layer 12 that is not masked by the photo masks 60a and 60b and cap layer 22, thereby forming a lower capacitor stack 70 and wiring line structure 210. The upper capacitor stack 50 and the lower capacitor stack 70, which consists of the first metal plate 12, the first capacitor dielectric layer 13, and the second metal plate 14, constitute a sandwiched capacitor structure 10. Referring briefly to FIG. 7, a 90-degree rotated view of the sandwiched capacitor structure 10 of FIG. 6 and the photo mask 60a thereon is illustrated. A portion of the cap layer 22 and the underlying third metal plate 16 of the upper capacitor stack 50 that are not covered with the photo mask 60a are also etched away in this dry etching process. Using the cap layer 22 as an etching buffer, the dry etching can be stopped on the second capacitor dielectric layer 15. In another case, the second capacitor dielectric layer 15 may be further etched through and the dry etching stops on the second metal plate 14. As best seen in FIG. 5, it is noted that the third metal plate 16 has a surface area that is smaller than the surface area of the second metal plate 14. The surface area of the second metal plate 14 is smaller than the surface area of the first metal plate 12.

Figure 8:
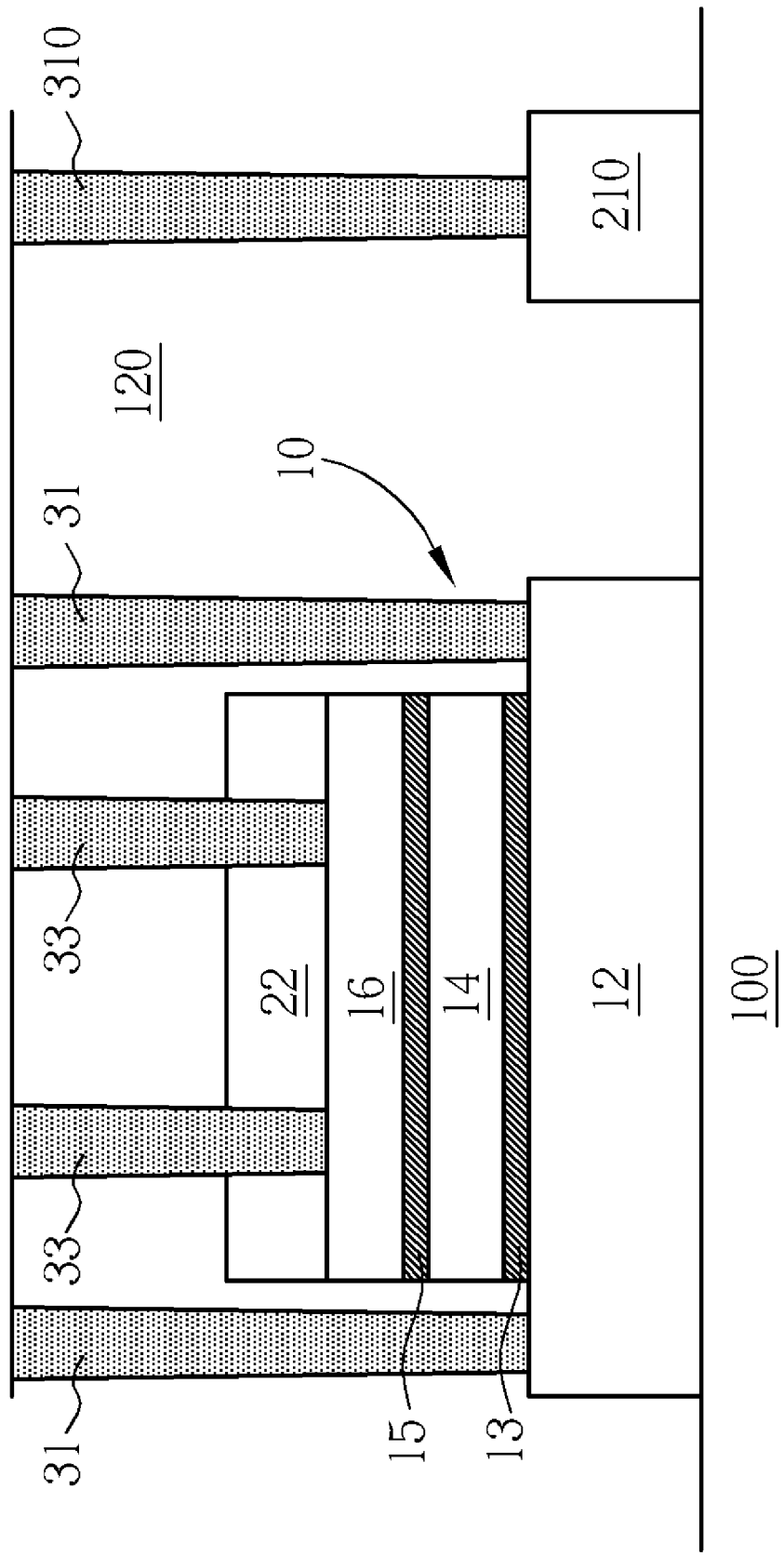
Figure 9:
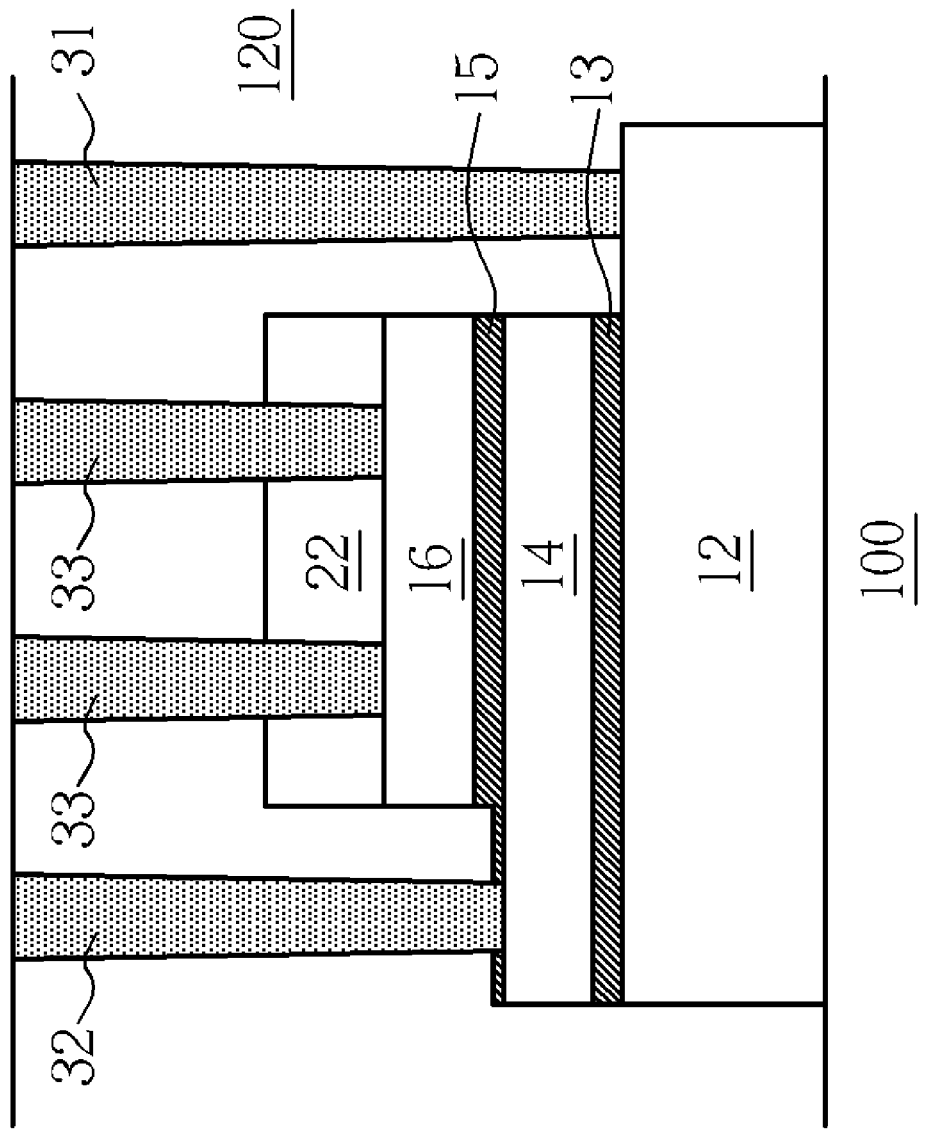

As shown in FIG. 8 and FIG. 9, wherein FIG. 9 shows a 90-degree rotated cross-sectional view of the capacitor structure 10 of FIG. 8, after stripping the photo masks, an IMD layer 120 is deposited on the capacitor structure 10, the base layer 100, and on the wiring line structure 210. The IMD layer 120 may be formed by CVD methods or other suitable techniques. After this, a plurality of metal vias 31, 32, 33, and 310 are formed in the IMD layer 120, wherein the metal vias 31 electrically connects with the first metal plate 12, the metal via 32 electrically connects with the second metal plate 14 (see FIG. 9), the metal vias 33 electricall connects with the third metal plate 16, and the metal via 310 electrically connects with the wiring line structure 210.

Figure 10:
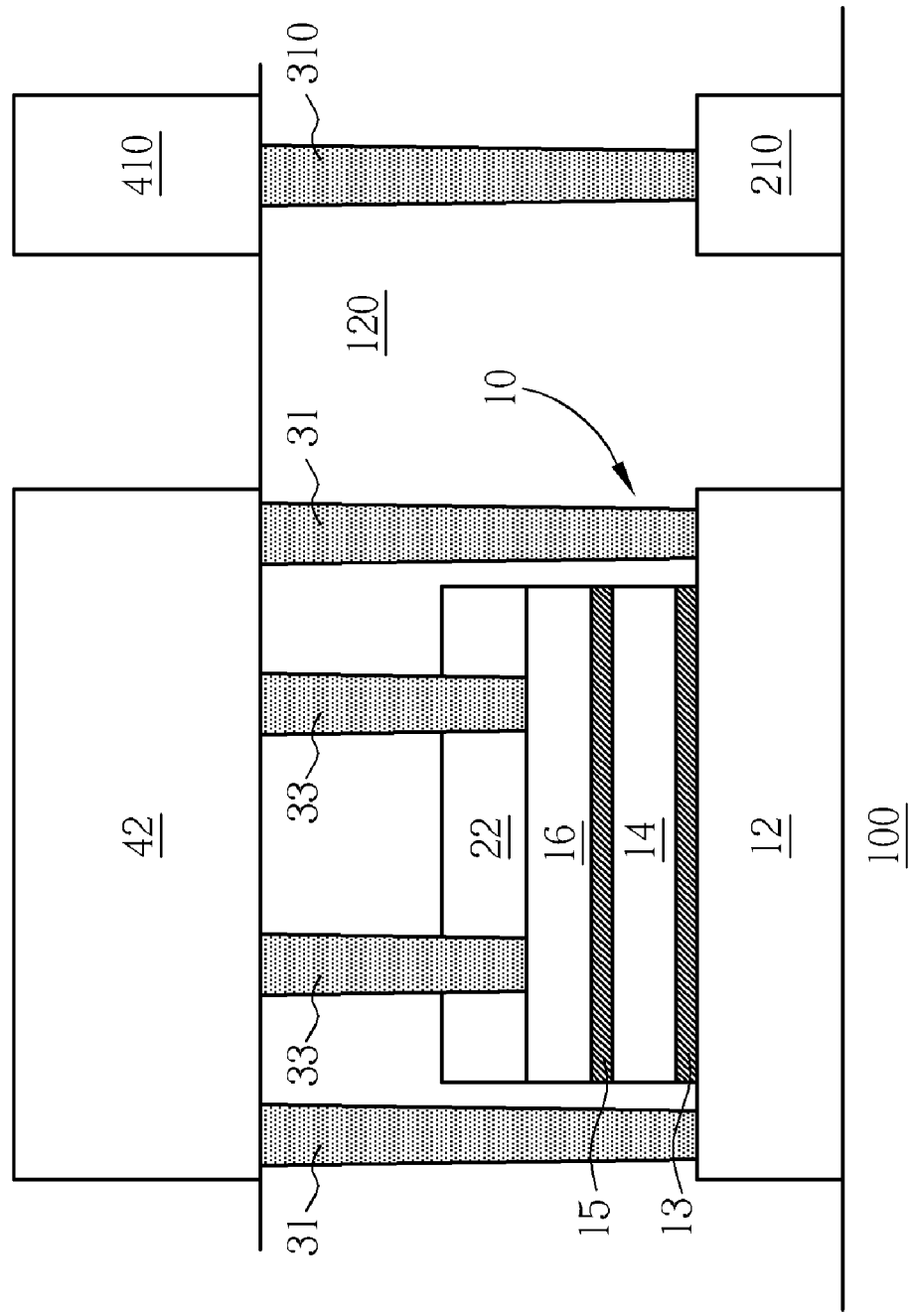
Figure 11:
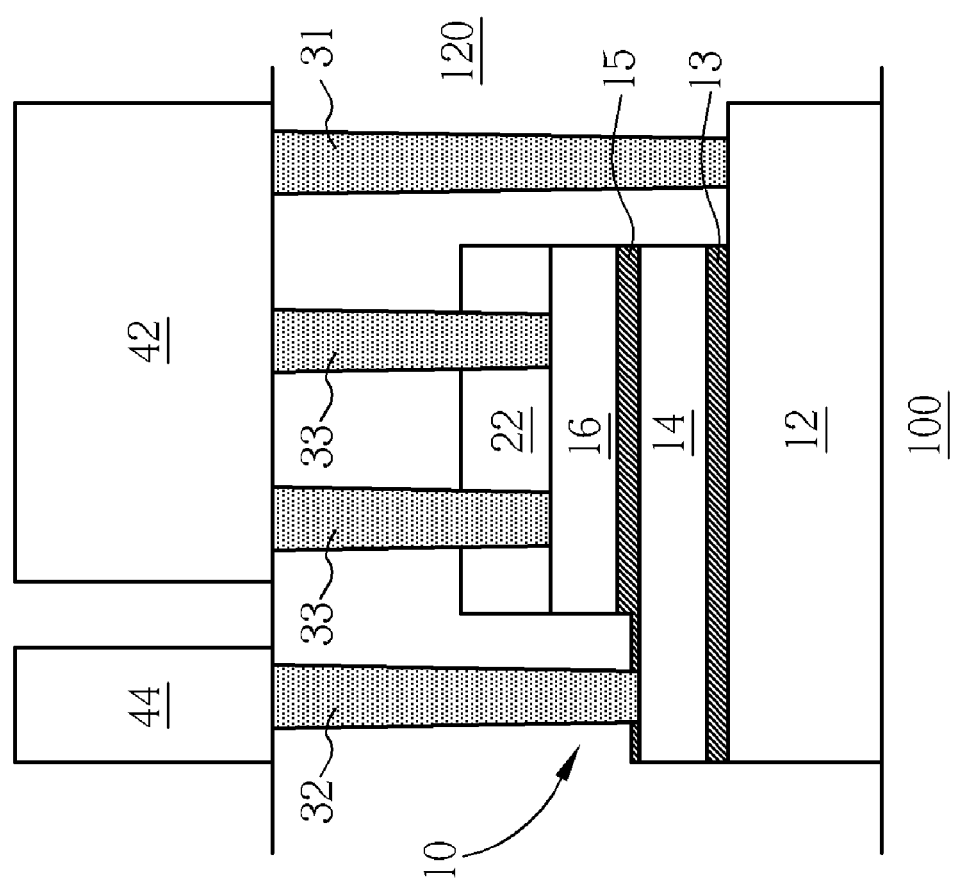

Finally, as shown in FIG. 10 and FIG. 11, wherein FIG. 11 shows a 90-degree rotated cross-sectional view of the capacitor structure 10 of FIG. 10, definition of Metal-4 interconnection is carried out on the IMD layer 120. A first conductive terminal 42 and a second conductive terminal 44 are formed above the capacitor structure 10 on the IMD layer 120. A fourth level interconnection line 410 is also defined above the metal via 310. The first conductive terminal 42 is electrically connected to the first metal plate 12 and the third metal plate 16 through the metal vias 31 and 33 respectively. The second metal plate 14 of the capacitor structure 10 is electrically connected to the second conductive terminal 44 through the metal via 32.

Those skilled in the art will readily observe that numerous modifications and alterations of the present invention may be made while retaining the teachings of the invention. Accordingly, the above disclosure should be construed as limited only by the metes and bounds of the appended claims.

What is claimed is:

1. A method for fabricating a metal-insulator-metal (MIM) capacitor, comprising the steps of:

providing a substrate;

forming, in the order of, a first metal layer, a first dielectric layer, a second metal layer, a second dielectric layer, a third metal layer, and a cap layer over the substrate;

etching the cap layer, the third metal layer, the second dielectric layer, the second metal layer, and the first dielectric layer to form an upper capacitor structure consisting of a second metal plate, a second capacitor dielectric layer, and third metal plate;

partially covering the upper capacitor structure with a photo mask that defines a first metal plate to formed in the underlying first metal layer;

simultaneously etching the first metal layer, a portion of the cap layer atop the second metal plate and the second metal plate of the upper capacitor structure that are not covered by the photo mask; and stripping the photo mask.

2. The method according to claim 1 wherein the second metal plate has a thickness that is thinner than that of the first metal plate.

3. The method according to claim 2 wherein the second metal plate has a thickness of about 1000 angstroms, and the first metal plate has a thickness of about 5000 angstroms.

4. The method according to claim 1 wherein the first and second capacitor dielectric layer are both made of PECVD dielectric.

* * * * *